(12) United States Patent
Chang et al.

(10) Patent No.: US 8,114,256 B2
(45) Date of Patent: Feb. 14, 2012

(54) CONTROL OF ARBITRARY SCAN PATH OF A ROTATING MAGNETRON

(75) Inventors: Yu Chang, San Jose, CA (US); William Kuang, Sunnyvale, CA (US); Ronald D Dedore, Scotts Valley, CA (US); Jitendra R. Bhimjiyani, Cupertino, CA (US); Wesley W Zhang, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1110 days.

(21) Appl. No.: 11/948,118

(22) Filed: Nov. 30, 2007

(65) Prior Publication Data

US 2009/0139854 A1    Jun. 4, 2009

(51) Int. Cl.
*C23C 14/35* (2006.01)
(52) U.S. Cl. ......... 204/192.13; 204/192.12; 204/298.03; 204/298.2
(58) Field of Classification Search ............. 204/192.12, 204/192.13, 298.03, 298.2
See application file for complete search history.

(56) References Cited

U.S. PATENT DOCUMENTS

| 5,762,766 | A | 6/1998 | Kurita et al. |
| 5,944,968 | A | 8/1999 | Kobayashi et al. |
| 6,852,202 | B2 | 2/2005 | Miller et al. |
| 2004/0050690 | A1* | 3/2004 | Green et al. ............. 204/192.13 |
| 2005/0211548 | A1* | 9/2005 | Gung et al. ............. 204/192.12 |

* cited by examiner

*Primary Examiner* — Rodney McDonald
(74) *Attorney, Agent, or Firm* — Charles S. Guenzer

(57) ABSTRACT

A control system and method for controlling two motors determining the azimuthal and circumferential position of a magnetron rotating about the central axis of the sputter chamber in back of its target sputtering and capable of a nearly arbitrary scan path, e.g., with a planetary gear mechanism. A system controller periodically sends commands to the motion controller which closely controls the motors. Each command includes a command ticket, which may be one of several values. The motion controller accepts only commands having a command ticket of a different value from the immediately preceding command. One command selects a scan profile stored in the motion controller, which calculates motor signals from the selected profile. Another command instructs a dynamic homing command which interrogates sensors of the position of two rotating arms to determine if the arms in the expected positions. If not, the arms are rehomed.

17 Claims, 7 Drawing Sheets

US 8,114,256 B2

CONTROL OF ARBITRARY SCAN PATH OF A ROTATING MAGNETRON

FIELD OF THE INVENTION

The invention relates generally to sputtering of materials. In particular, the invention relates to the control of the scan path of a magnetron in back of a plasma sputtering target.

BACKGROUND ART

Sputtering, alternatively called physical vapor deposition (PVD), is the most prevalent method of depositing layers of metals and related materials in the fabrication of semiconductor integrated circuits. The commercially most important form of sputtering is plasma sputtering using a magnetron in back of the sputtering target to increase the density of the plasma and increase the sputtering rate. A typical magnetron includes a magnetic pole of one magnetic polarity surrounding another magnetic pole of the opposed magnetic polarity. A gap of nearly constant width and forming a closed loop separates the two poles and sets up a closed plasma track adjacent the sputtering face of the target.

Magnetron sputtering was originally used to deposit a nearly planar and relatively thick layer of a metal such as aluminum, which was thereafter etched into a pattern of horizontal interconnects. A typical magnetron used for this type of sputtering has a relatively large kidney shape with the closely adjacent poles positioned near the periphery of the pattern. The magnetron extends from about the center of the target to near its usable periphery and is rotated about the target center to produce uniform sputtering of the target and hence sputter deposition on the wafer. The large size of the magnetron can produce fairly uniform target erosion and uniform thickness of the sputtered layer deposited on the wafer.

More recently, however, magnetron sputtering has been extended to deposit thin, nearly conformal layers into high aspect-ratio holes formed in dielectric layers, such as vias for vertical interconnects or trenches for capacitive memories. Examples of such sputtered layers include a barrier layer of, for example, tantalum and tantalum nitride, to prevent migration of metal into the underlying dielectric or a copper seed layer to act as plating electrode and nucleation layer for copper later filled into the via hole by electrochemical plating (ECP). Sputtering into such deep and narrow holes relies in part on a large fraction of sputtered atoms being ionized in a high-density plasma adjacent the target, which can be achieved by a small magnetron which concentrates the target power to a small area of the target, thus producing a high power density and corresponding adjacent high-density plasma region. It has been found that small magnetrons scanned near the periphery of the target effectively can nonetheless produce a nearly uniform sputter deposition over the entire wafer because the sputtered ions diffuse toward the center of the wafer as they travel from the target to the wafer.

However, it is sometimes desired to sputter a wider band on the target with a smaller magnetron. Miller et al. describe a planetary magnetron (PMR) in U.S. Pat. No. 6,852,202, incorporated herein by reference. In the PMR sputter chamber, an inner arm is rotated about the target center and an outer arm spins about an pivot axis at an end of the inner arm and has a magnetron mounted on its end offset from the pivot axis. The described PMR mechanism includes a planetary gear mechanism with a sun gear fixed at the target center and coupled to a gear rotating on the pivot axis and supporting the second arm. The planetary gear mechanism produces a multi-lobed scan pattern in which the radial extent of the scan pattern and the number of lobes is established by the lengths of the two arms and the gear ratio of the gear mechanism. Although this scan pattern has been quite effective in advanced sputtering applications, the lobed scan pattern may not be the optimal one and it is desired to change the scan pattern without changing physical parts of the scan mechanism.

SUMMARY OF THE INVENTION

A system and method control two motors causing the movement of an magnetron along a nearly arbitrary path on the back of a sputtering target. A system controller periodically sends command to a motion controller which interprets those commands and accordingly drives the two motors.

According to one aspect of the invention, each command includes a command ticket which can assume one of several acceptable values as well as a possible no-operation value. The system controller may resend commands with the same value of the command ticket but changes the value for a new command. The motion controller does not change its control of the motors upon receipt of a command unless that command includes a command ticket with an acceptable value other than that of the previously received command.

According to another aspect of the invention, plural scanning profiles of a magnetron scanning path are stored in the motion controller. One command is a profile command selecting one of the stored profiles. Upon receipt of the profile command, the motion controller controls the motors to execute the selected profile.

According to yet another aspect of the invention, the system includes two sensors which can detect when respective arms or other members of the scan mechanism pass nearby. One command is a dynamic homing command. Upon receipt of the dynamic homing command, the motion controller causes the arms to move along preselected paths and determines if the sensors detect the arms at the expected times. If not, the control system rehomes the scan mechanism.

DETAILED DESCRIPTION OF THE PREFERRED EMBODIMENTS

Figure 1:
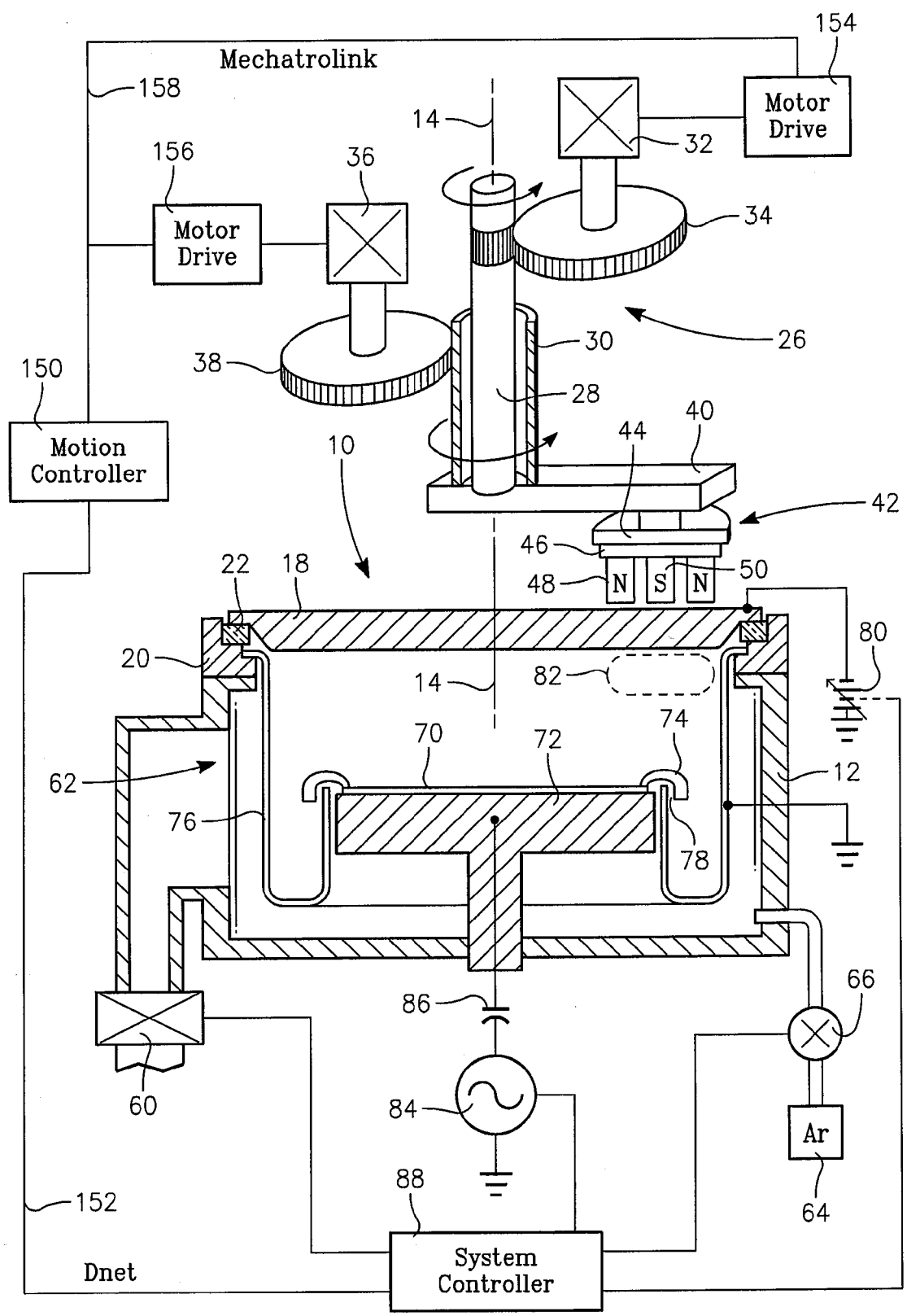
FIG. 1 is a schematic cross-sectional view of a sputter chamber including an embodiment of the motor control system for an epicyclic magnetron scanning mechanism.

Miller et al. (hereafter Miller) describe a two-shaft epicyclic magnetron scan mechanism in U.S. patent application Ser. No. 11/924,573, filed Oct. 25, 2007 and incorporated herein by reference particularly for the detailed mechanism and scan patterns available. According to Miller, a sputter chamber 10 schematically illustrated in the cross-sectional view of FIG. 1 includes a conventional main chamber 12 generally symmetric around a central axis 14 and supporting a target assembly 18 through an adapter 20 and an isolator 22. The target assembly 18 may be formed from the material to be sputtered or may include a target tile facing the interior of the chamber body 12 and bonded to a backing plate extending laterally over the isolator 22.

The sputter chamber 10 also includes an epicyclic scan actuator 26 located in the back of the target assembly 18 and including an inner rotary shaft 28 and a tubular outer rotary shaft 30, which are coaxial and are arranged about and extend along the central axis 14 and can rotate about it. A first motor 32 is coupled to the inner rotary shaft 28 by a drive gear 34 or other mechanical means such as a belt wrapped around two pulleys to rotate it. A second motor 36 is similarly coupled to the outer rotary shaft 30 through another drive gear 38 or mechanical means to rotate it independently of the rotation of the inner rotary shaft 28. The rotary shafts 28, 30 are coupled to an epicyclic mechanism 40, which supports a magnetron 42 through a mount 44 and scans it over the back of the target assembly 18 in a nearly arbitrary pattern determined by the rotations of the rotary shafts 28, 30. The principal embodiment of the Miller epicyclic mechanism 40 is a planetary gear system which differs from the PMR mechanism by a sun gear which is rotated by the inner rotary shaft 28 rather than being fixed, as is described in more detail by Miller and will be described in lesser detail below. The magnetron 42 typically includes a magnetic yoke 46 supporting and magnetically coupling an inner pole 48 of one magnetic polarity along the central axis 14 and an outer pole 50 of the opposed magnetic polarity and surrounding the inner pole 48. The magnetron 42 and large portions of the epicyclic mechanism 40 are disposed in an unillustrated cooling reservoir of recirculating chilled sealed to the back of the target or its backing plate in order to maintain the target assembly 18 at a reasonably low temperature.

Returning to the main chamber 12, a vacuum pump 60 pumps the interior of the main chamber 12 through a pumping port 62. A gas source 64 supplies a sputter working gas, such as argon, into the chamber 12 through a mass flow controller 66. If reactive sputtering is desired, for example, of a metal nitride, a reactive gas, such as nitrogen in the example, is also supplied.

A wafer 70 or other substrate is supported on a pedestal 72 configured as an electrode in opposition to the target assembly 18. A clamp ring 74 may be used to hold the wafer 70 to the pedestal 72 or to protect the pedestal periphery. However, many modern reactors use electrostatic chucks to hold the wafer 70 against the pedestal 72. An electrically grounded shield 76 supported on the adapter 20 protects the chamber walls and sides of the pedestal 72 from sputter deposition and also acts as an anode in the plasma discharge. The working gas enters the main processing area through a gap 78 between the clamp ring 74 or pedestal 72 and the shield 76. Other shield configurations may include an electrically floating secondary shield inside the primary shield 76 and perforations through portions of the primary shield 76 protected by the secondary shield to promote gas flow into the processing area.

A DC power supply 80 negatively biases the target assembly 18 with respect to the grounded shield 76 and causes the argon working gas to be excited and discharge into a plasma. The magnetron 42 concentrates the plasma and creates a high density plasma (HDP) region 82 underneath the magnetron 42 inside the main chamber 12. The positively charged argon ions are attracted to the target assembly 18 with sufficient energy to sputter the metal from the target assembly 18. The sputtered metal deposits on and coats the surface of the wafer 70. Preferably for sputter depositing into deep and narrow holes, an RF power supply 84 is connected to the pedestal electrode 72 through a capacitive coupling circuit 86, which acts as a high-pass filter, to create a negative DC self bias on the wafer 70 with respect to the plasma. The self bias is effective at accelerating positive metal ions or possibly argon ions toward the wafer 70 in perpendicular trajectories that more easily enter high-aspect holes. The self bias also imparts a high energy to the ions, which may be controlled to differentiate sputter deposition on the wafer 70 and sputter etching of the wafer 70. A computer-based system controller 88 controls the vacuum pump 60, the argon mass flow controller 66, the power supplies 80, 84 and the drive circuits for the magnetron motors 32, 36 according to the desired sputtering conditions and scan patterns input to the system controller 88 through a recordable medium such as a CDROM inserted into it or equivalent communication lines.

Figure 2:
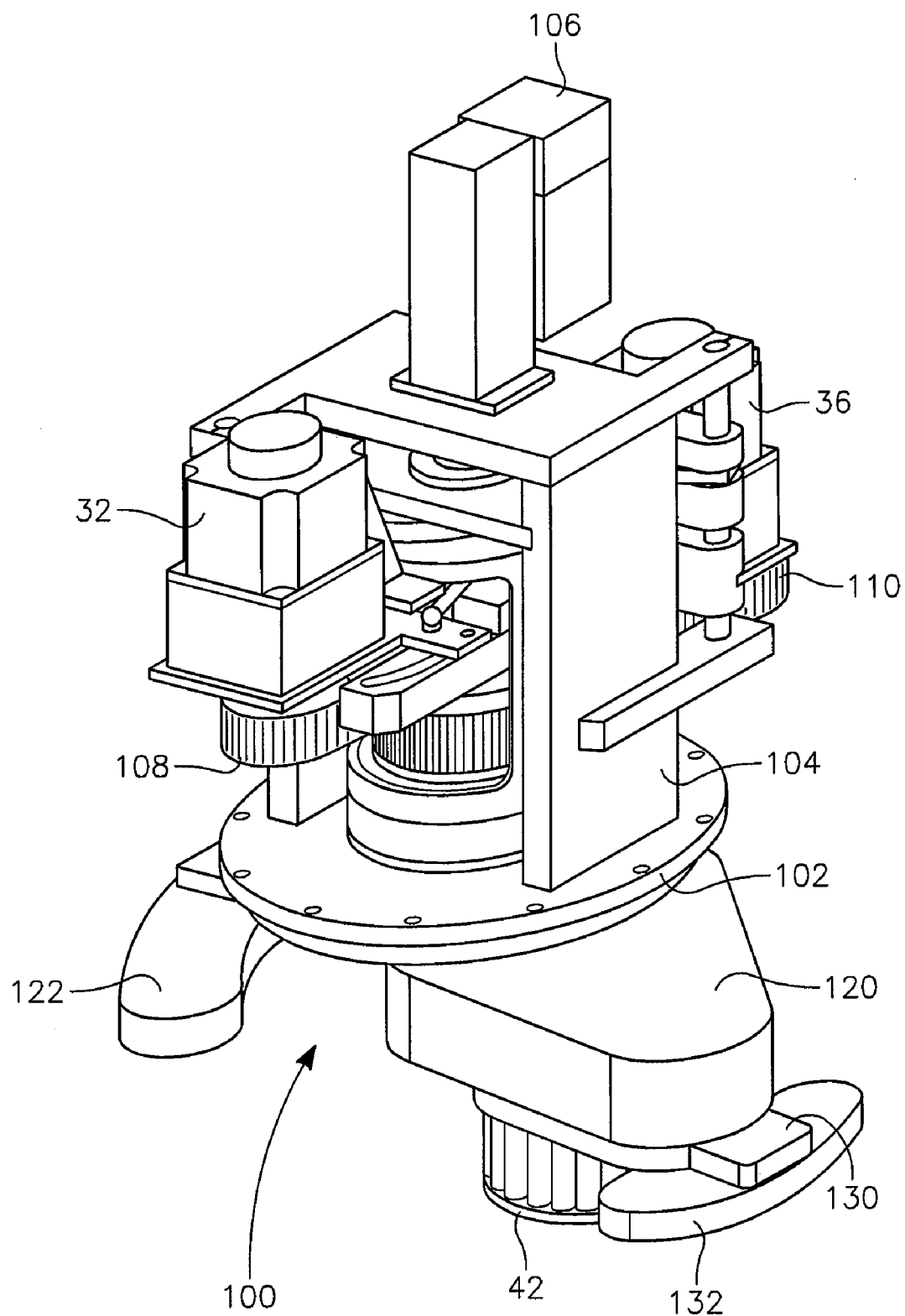
FIG. 2 is an orthographic view of a universal magnetron scanning mechanism.

A more realistic version of the epicyclic scan actuator 26 and attached magnetron 42 is incorporated into a mechanism illustrated in the orthographic view of FIG. 2 in what is referred to as a universal magnetron motion (UMM) mechanism 100. The UMM mechanism 100 is supported on a flange 102, which is supported on and sealed to a top wall of the cooling reservoir. A derrick 104 supported on the flange 102 outside of the reservoir supports a vertical actuator 106 which can vertically move a slider which rotatably supports the rotary shafts 28, 30 and the motors 32, 36 coupled to them through ribbed belts 108, 110.

Figure 3:
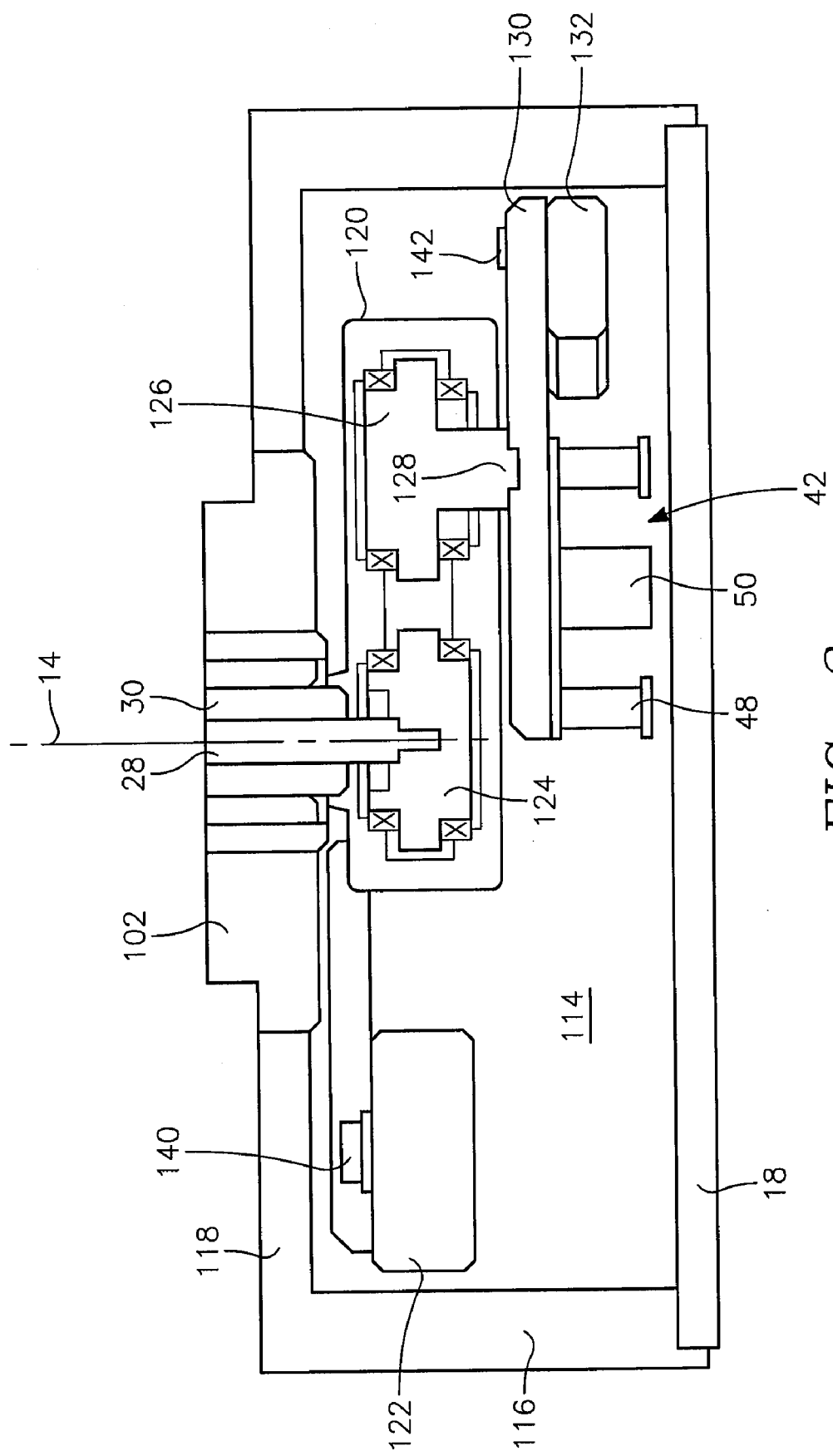
FIG. 3 is a cross-sectional view of part of the magnetron scanning mechanism of FIG. 2.

A sectioned side view of FIG. 3 illustrates a cooling reservoir 114 formed in back of the target assembly 18 by a reservoir sidewall 116 and a reservoir top wall 118 on which the actuator flange 102 is supported. A water-sealed gearbox 120 and its counterweight 122 are fixed to the lower end of the outer rotary shaft 30 inside the reservoir 114. A sun gear 124 is fixed to the lower end of inner rotary shaft 28 inside of the case 120 but is also captured between two sets of bearings. A follower gear 126 is rotatably supported between another two sets of bearings inside the gearbox 120 and is coupled through an unillustrated idler gear to the sun gear 124. A shaft 128 of the follower gear 126 passes through a rotary seal on the bottom of the gearbox 120 and is fixed to a magnet arm 130 such that the magnet arm 130 is rotated by the follower gear 126. The magnetron 42 and its counterweight 132 are fixed to opposed ends of the magnet arm 130. The gearbox 120 acts as an inner arm and the magnet arm 130 acts as the outer arm which in conjunction with the sun and follower gears 124, 126 act as a planetary gear mechanism.

The two separately controlled rotary shafts 28, 30 allow the magnetron 42 to be scanned in a nearly arbitrary pattern. However, this wide control requires that the two motors 32, 36 be closely controlled together. That is, for many more complicated scan patterns, the rotation of one motor must be closely synchronized with that of the other motor. If the timings of the rotary shafts 28, 30 begin to drift apart, for example, if one of the ribbed belts 108, 110 slips, the scan pattern rapidly degrades.

Figure 4:
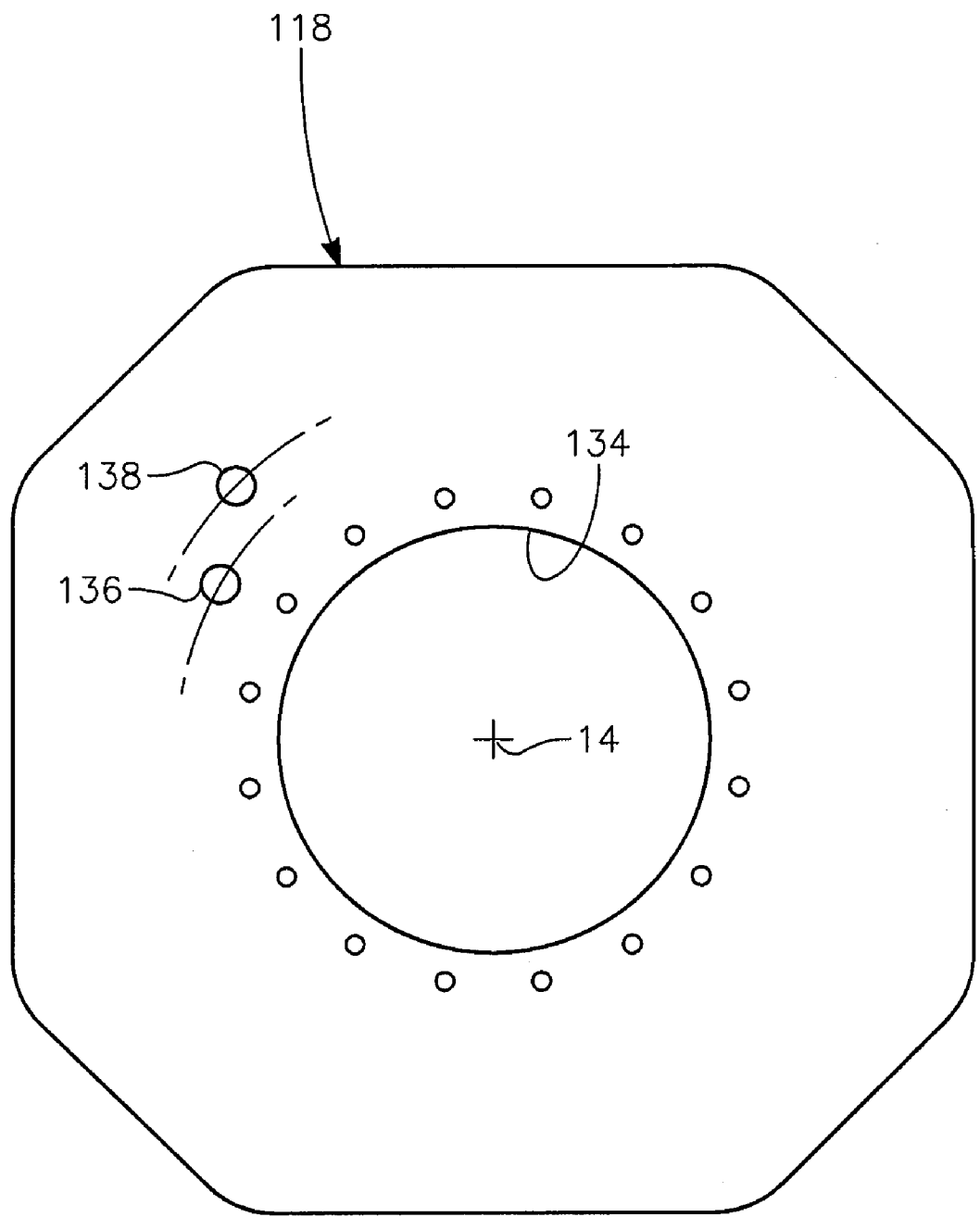
FIG. 4 is a plan view of reservoir top wall on which the magnetron scanning mechanism is mounted and providing mounting holes for optical sensors associated with it.

A further problem with the independent control of the two rotary shafts 28, 30 is that their relative rotation phase needs to be established and maintained. Following the Miller design, as illustrated in the plan view of FIG. 4, the top reservoir wall 118 includes a central aperture 134 around which the actuator flange 102 is sealed and passing the rotary shafts 28, 30 into the reservoir 114. The top reservoir wall 118 also includes a first sensor aperture 136 offset from the central axis 14 for a gearbox sensor and a second aperture 138 at a different radius from the central axis 14 for a magnet arm sensor. In this design, the sensor apertures 136, 138 are located 15° apart at two different radii with respect to the central axis 14. The sensors which are inserted into the sensor apertures 136, 138 enable a homing function to establish and then monitor the rotation state of the two planetary arms. The sensors optically sense reflectors 140, 142, shown in FIG. 3, mounted respectively on tops of the counterweights 122 and 132, which are respectively angularly fixed with respect to the gearbox 120 and magnet arm 130.

Once the two arms have been home homed, the timing or relative phase of their rotations needs to be maintained. In one embodiment for improving the synchronism, a computer-based motion controller 150, shown in FIG. 1, is interposed between the system controller 88 and the motors 32, 36 driving the rotary shafts 28, 30. For example, a DeviceNet (Dnet) communication link 152 transfers commands from the system controller 88 to the motion controller 150. The Dnet communication system is a well known industrial computerized control system demonstrating high reliability and ruggedness. The motion controller 150 in turn controls two motor drives 154, 156 over a communication link 158, for example, based on the well known Mechatrolink control protocol, which includes a two-wire bus operating in a master/slave synchronous mode with baud rates of 4 Mbps and above for string sizes of 17 or 32 bytes and cycle times of 8 ms and below. Further details may be found at the web site www-.mechatrolink.org. The motion controller operating according to the Mechatrolink protocol can thus operate much faster and with more regularity than the polling of the system controller 118. In general, the motion controller 150 sends different sets of motion control signals to the two motor drives 154, 156 indicating the respectively required motion of the two motors 32, 36. The motor drives 154, 156 respectively drive the two motors 32, 36 with the required phase between the rotations of the motors 32, 36.

The system controller 88 sequentially polls the various elements under its control by transmitting the current control setting to the respective element. The polling period is on the order of a second or somewhat less, which is not satisfactory for direct Dnet control of the two motor drives 154, 156. Instead, the motion controller 150 receives the current Dnet control setting, interprets it, and accordingly performs rapid and nearly continuous control of the motor drives 154, 156.

Figure 5:
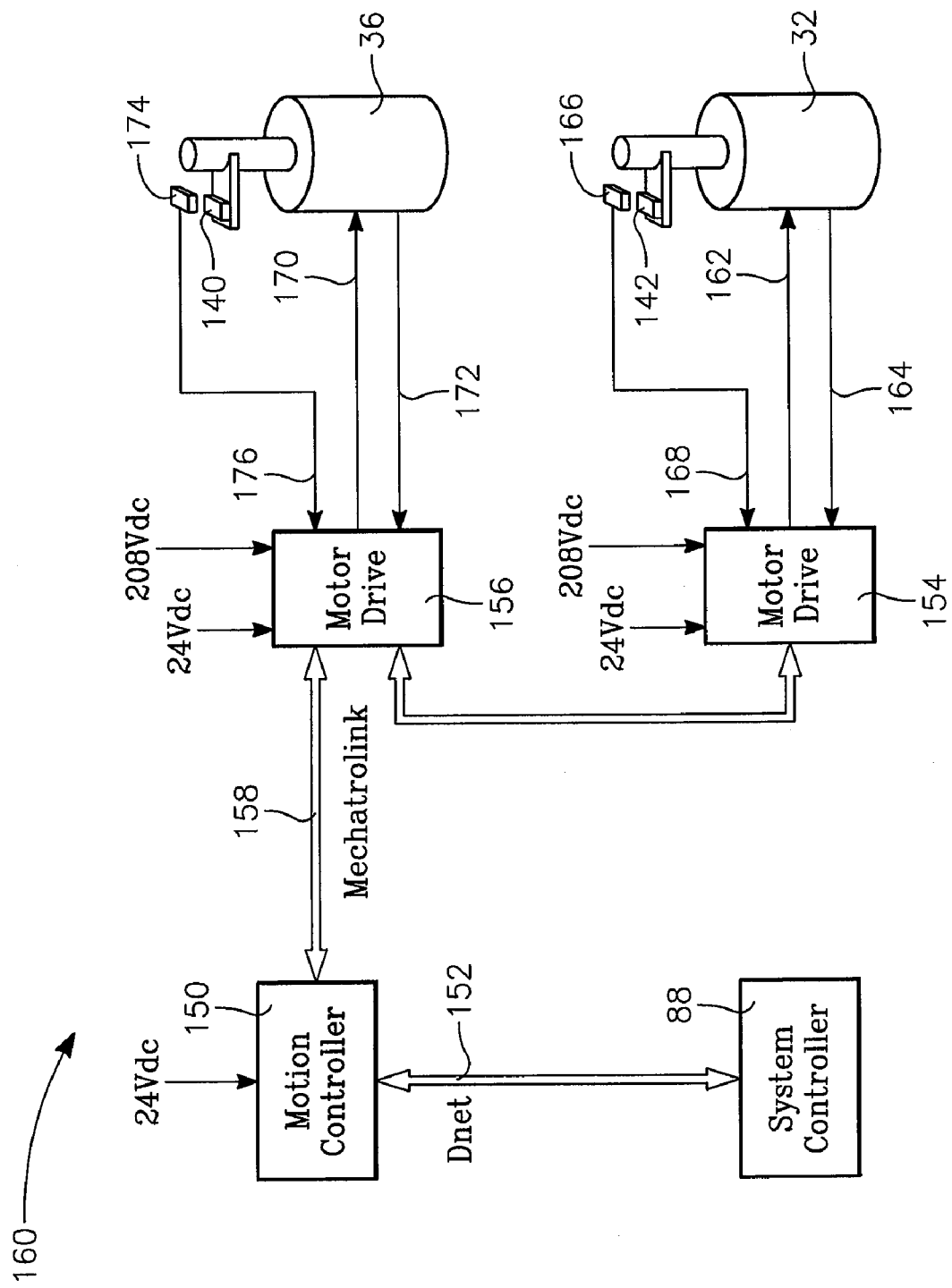
FIG. 5 is diagram of an embodiment of a motor control circuit according to the invention.

A motor control circuitry 160 is shown in more detail in the schematic diagram of FIG. 5. The motion controller 150, which may be a Yaskawa MP2300, is powered by a 24 VDC supply and communicates with the system controller 180 over the Dnet communication link 152. Each of the motor drives 154, 156, which may be a respective Yaskawa SGDS-08A12A, communicates with the motion controller 150 over a Mechatrolink communication link 158. Each of the motor drives 154, 156 is powered from a 208 VAC supply required for the motors 32, 36 and also from a 24 VDC supply needed for the sensors. The motor drive 154 for the magnet arm 130 drives the associated motor 32, which in this embodiment is a servo motor, over a drive line 162 and receives a feedback signal from the encoder of the servo motor 32 over a feedback line 164. The motor 32 for the magnet arm 130 will be referred to in the software explanation as the M2 motor. The arm motor drive 154 also receives a detection signal from a sensor 166 over a detection line 168. The sensor 166 may be an optical sensor, such as an Omron E3T-SR21, which both emits a beam of light and receives a reflected beam from the reflector 142 associated with the magnet arm 130 to establish a position of the magnet arm 130. Similarly, the motor drive 156 for the gearbox 120 drives the associated motor 36, also a servo motor, over a drive line 170 and receives a feedback signal from the encoder of the servo motor 36 over a feedback line 172. The motor 36 for the gearbox 120 will be referred to as M1. The gearbox motor drive 156 also receives over a detection line 176 from a sensor 174 such as the previously described optical sensor a detected reflected beam from the reflector 140 associated with the gearbox 120 to establish an angular position of the gearbox 120.

One mode of controlling the scan paths through the control circuitry 160 of FIG. 2 would be to instruct each of the motors 32, 36 to rotate at respective rotation rates once the associated arms have been positioned with the desired phase between them. For example, if the arm motor 32 is instructed to be stationary while the gearbox motor 36 rotates at a set rotation rate, the resulting scan path is that of the previously described PMR scan system with a fixed sun gear. In another example, if the arm and gearbox motors 32, 36 are instructed to rotate at the same rate in the same direction, the magnetron traces a circular path about the target center 14 with the radius determined by the initial phase between the two arms.

Both of these simple patterns could be easily achieved with the use of the intermediate motion controller 150. However, the relatively slow cycle time of the Dnet controller 58 creates difficulties with more complex scan patterns. For example, a scan pattern 180 illustrated in FIG. 6 includes a generally circular scan about the target center 14 near the target periphery and two smaller, somewhat circular scans offset from the center 14, all to be performed in a few seconds. A similar scan pattern is portrayed in the graph of FIG. 7 in which trace 182 plots the angular position in degrees of the center of the magnetron as a function of time and trace 184 plots its radial position in units of 0.1 inch (2.54 mm). The angle trace 182 shows the points of a profile. The radius trace 182, though illustrated as continuous, includes corresponding profile points. This complex scan pattern needs closer control than that afforded by the Dnet communication protocol when the rotation rate is in the typical range of 60 rpm.

In one embodiment of the invention, the system controller 88 periodically polls the motion controller 150 on a somewhat coarse time scale while the motion controller 150 much more tightly and quickly controls the motor drives 154, 156. The polling may include both commands to the motion controller 150 and interrogations of it to determine status of the elements associated with it. An example of a command format for a command sent from the system controller 88 to the motion controller 150 is presented in TABLE 1. The command consists of 8 bytes each of 7 bits.

TABLE 1

| Byte | Bit-7 | Bit-6 | Bit-5 | Bit-4 | Bit-3 | Bit-2 | Bit-1 | Bit-0 |
|---|---|---|---|---|---|---|---|---|
| 0 | Command Ticket | | | | Command Code | | | |
| 1 | Enable | | Hard Stop | | | | | |
| 2 | | | | | Command Data | | | |
| 3 | | | | | Command Data | | | |
| 4 | | | | | Command Data | | | |
| 5 | | | | | Command Data | | | |
| 6 | | | | | Spare | | | |
| 7 | | | | | Spare | | | |

Two bits of the 0 byte present the command ticket. The command ticket accommodates the difference between the relatively infrequent polling between the system controller 88 and the much quicker and tighter control of the motor drives 154, 156 taking into account that the polling includes the most recent command even if that command is already being executed. The command code may assume any of four values 00, 01, 10, 11. The 00 command ticket is a NOP, that is, to be ignored. Both the system controller 88 and the motion controller 150 keep track of the sequence of commands which have recently been sent. The system controller 88 in each polling period sends a command. If the command is the same as in the last polling period, the command ticket remains the same. If the command changes from the last polling period, the system controller 88 changes the command ticket to a new value among the three active values 01, 10, 11. The command ticket values do not necessarily have to cycle regularly through the three allowed values. That is, a command ticket of 01 or 11 following a previous command ticket of 11 will be interpreted as a new command ticket to be processed. On the other end, when the motion controller 150 receives a command with a command ticket of the same value as the last receive command ticket, it is basically ignored since the command has already been processed.

The 6-bit COMMAND CODE instructs the motion controller 150 to perform one of many operations, several of which will be described later.

An active ENABLE bit turns on both the M1 and M2 servo drives. The ENABLE bit should be turned inactive whenever drive engagement is undesirable, such as when changing parts or when a hardware interlock indicates an operational problem. An active HARD STOP bit acts an EMO, that is, stop operation as quickly as possible. The motors are stopped at their maximum deceleration. The HARD STOP overrides the ENABLE.

The command contains 4 bytes of command data, the format of which depends upon the command. There are 2 bytes of spare formatting in the command protocol awaiting further development of the protocol.

An initial and exemplary set of command codes are present in TABLE 2. Although the command code is defined by six bits, the tabulated 16 command codes are numbered in hexadecimal and require only four bits.

TABLE 2

| COM CODE | DEFINITION |
|---|---|
| 0 | NOP |
| 1 | HOME |
| 2 | ROTATE |
| 3 | STOP |
| 4 | MOVE M2 |
| 5 | PROFILE |
| 6 | CONFIRM HOME |
| 7 | SPIN M2 |
| 8 | STOP SPIN M2 |
| 9 | MOVE M1 |
| A | CLEAR ALARM |
| B | SET ROTATION ACCEL |
| C | SET MOVE M2 ACCEL |
| D | SET MOVE M2 SPEED |
| E | SET SPIN M2 ACCEL |
| F | GET |

A "0" command code indicates a NOP, that is, to be ignored.

Figure 8:
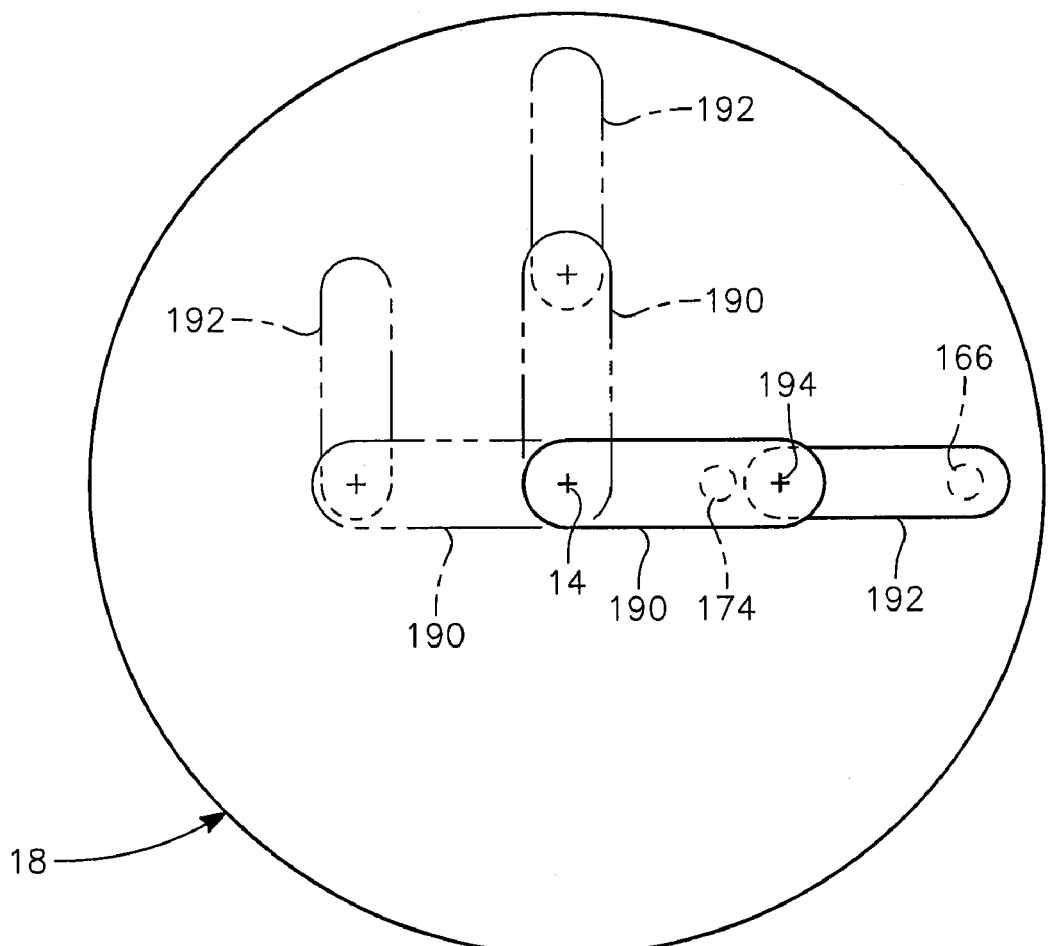
FIG. 8 is a schematic plan view of a model of the scanning mechanism used to explain the operation of some of the commands.

A "1" command code indicates a HOME command to establish initial conditions for the angular positions of both the motors 32, 36 and hence of the magnet arm and the gearbox with the use of the sensors 166, 174 and their associated reflectors 142, 140. This command may be issued prior to continued production operation. An illustrative example of the homing procedure is illustrated at the 3 o'clock position in the schematic plan view of FIG. 8, in which an inner arm 190 rotates about the central axis 14 of the target assembly 18 and an outer arm 192 rotates about a pivot axis 194 near the distal end of the inner arm 190 and supporting an unillustrated magnetron near the distal end of the outer arm 192. The inner arm 190 corresponds to the gearbox 120, the outer arm 192 corresponds to the magnet plate 130, and the pivot axis 194 corresponds to the axis of the shaft of the follower gear 126. The sensors 166, 174 are positioned over the rotatable arms 190, 192. The inner sensor 174 will trigger for every rotation of the outer rotary shaft 30. The object is, even if the position of the arms 190, 192 is unknown, to position them under their respective sensors 174, 166 to initialize their positions. The outer sensor 166 will trigger for every rotation of the inner rotary shaft 28 but only when the two arms 190, 192 are aligned. The figure assumes that the home position in the one in which the arms 190, 192 in their home positions are parallel with maximal extent of the outer arm 192 and does not include the complexity of the planetary gear mechanism of FIGS. 2-4 that the sensors 166, 174 are not arranged along a single radius and that the reflectors 140, 142 associated with the arms 190, 192 may be located at different angular positions, for example, on the counterweights located across the central axis 14 opposite the arms 170, 172 forming the planetary gear system. For example, this means that once the inner arm 190 has been initialized, it is rotated 165° to allow the initialization of the outer arm 192.

The homing procedure first begins with the motion controller 150 instructing the gearbox motor 36 to rotate the inner arm 190 until the inner sensor 174 indicates its underlying position. The sensor detection may be slow so that it is necessary for the procedure to hunt for the inner home position by subsequent back and forth movement of the inner arm 190 across the position of the inner sensor 174 until an inner home position is established. Then, with the inner arm parked in its home position, the motion controller instructs the arm motor 32 to rotate the outer arm 192 until the outer sensor 166 indicates its underlying position. Again, hunting for the outer home position may be required. The result is the illustrated home positions of the two arms 190, 192 from which all subsequent movement is referenced.

A "2" command code indicates a ROTATE command, which instructs the two motors 32, 36 to rotate at the same rate in the same direction. For a planetary gear system, equal rotation means that the two arms 190, 192 rotate in parallel so that, as illustrated in the 12 o'clock position in FIG. 8, the two arms 190, 192 remain aligned. If the ROTATE command is issued while the arms 190, 192 are out of phase, that is, not aligned, the subsequent synchronous rotation maintains the phase between the arms 190, 192 during subsequent rotation.

A "3" command code indicates a STOP command, which stops the rotations of the motors 32, 36 if they are indeed in motion.

A "4" command code indicates a MOVE M2 command, which causes the motor 32 to move the outer arm 130 to a phase angle, specified in the data field of the command, relative to the angular position of the gearbox 120. For example, if a MOVE M2 command were issued after the arms had been positioned in the 12 o'clock position of FIG. 8 such that the outer arm 192 would move in a retrograde motion to a new angular position relative to the inner arm 190, a resultant positioning is shown in the 9 o'clock position in which the outer arm 192 is now perpendicular to the inner arm 190 with its distally supported magnetron well inside the periphery of the target assembly 18.

A "5" command codes indicates a PROFILE command, which greatly facilitates the control of complex scan patterns with a relatively slow system controller 88. The scan pattern 180 of FIG. 6 can be decomposed into a number of sections 190 connected between adjacent profile points 192. The PROFILE command in essence allows the motion controller 150 to consult a locally stored profile pattern based on the profile points 192 to instruct the motors 32, 36 to cause the magnetron to be scanned along the desired profile 180.

Multiple profiles may be pre-loaded in the motion controller 150. Two bytes of command data in the data command may be used to select which of the stored profiles is to be used. Two more bytes of command data may be used to indicate a profile factor, which represents the total run time of the profile, for example, in millisecond.

The profiles may be stored in the memory of the motion controller 150 in various forms. However, one convenient format illustrated in TABLE 3 for a scan pattern similar to that of FIGS. 6 and 7 includes a series, except for the first entry, of paired values of time, for example, enumerated in seconds, and a phase angle of the outer arm 192 relative to the inner arm 190. Other scan patterns are also stored in the motion controller 150.

TABLE 3

| | |
|---|---|
| 401 | 0 |
| 0 | 0 |
| 0.0025 | 0 |
| 0.005 | 0 |
| 0.0075 | 0 |
| 0.01 | 0 |
| . | . |
| . | . |
| 0.13 | 0 |
| 0.1325 | 20 |
| 0.135 | 78 |
| 0.1375 | 176 |
| . | . |
| . | . |
| 0.995 | 360000 |
| 0.9975 | 360000 |
| 1. | 360000 |

The first entry in the table indicates the number of position data to follow in the table. In the remainder of the table, the first column indicates a time, for example, in seconds with a total elapsed time of 1 s with a constant time difference in 2.5 ms between the entries, and the second column indicates a phase angle between the outer arm and the inner arm, for example, in units of milli-degrees. The table may be extended for longer scan times, for example, a typical 4 s. The indicated pattern controls the magnetron to first scan in a generally circular pattern near the periphery of the target before changing to a more complex pattern, which ends up with another outer circular scan.

The motion controller 150 normalizes the 1-sec period of the stored trajectory according to the profile factor included in the data field of the PROFILE command. The rotation rate of the inner arm 190, to which the rotation of the outer arm 192 is referenced by the PROFILE command, may be set by a preceding ROTATE command. The motion controller 150 may perform a calculation from the profile table to determine at what rate the motor for the outer arm 182 needs to rotate to move the magnetron from the previous position in the profile table to the next position. The rotation rate set by the ROTATE command determines the length of time for the scan pattern set by the PROFILE command. More complicated paths between two or more neighboring points on the selected profile may be calculated. Significantly different multiples profiles may be pre-loaded into the motion controller 150 to be selected by the system controller 88.

Figure 9:
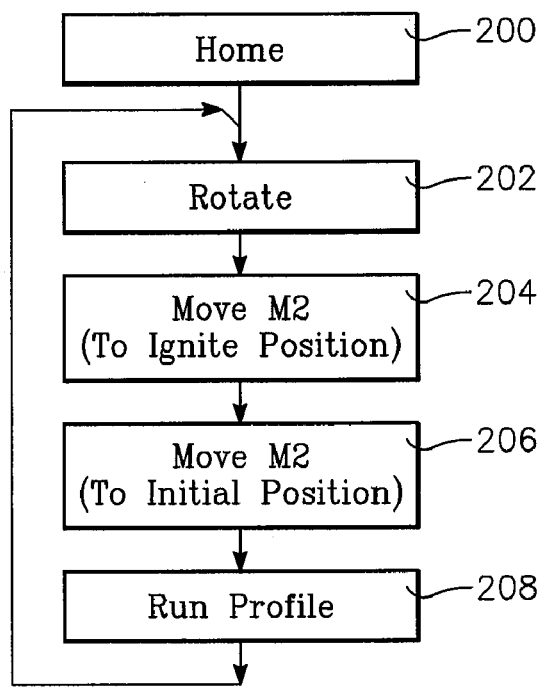
FIG. 9 is a flow diagram of one method of operating the scanning mechanism with one command protocol consistent with the invention.

One process for scanning a magnetron in accordance with a stored profile is illustrated in the flow diagram of FIG. 9. In step 200, the HOME command causes both motors and their associated arms to home to their home positions. It is not necessary that the home positions correspond to maximal extent of the arms, only that their positions be known. In step 202, the ROTATE command causes both motors and hence their arms in the case of a planetary gear mechanism to rotate at a same rate, for example, 60 Hz, thus producing a circular scan of the magnetron about the central axis. In step 204, the MOVE M2 command instructs the outer arm to move the magnetron to a position facilitating ignition of the plasma, for example, near the chamber wall at the target periphery. Once the plasma has been ignited, in step 206, a MOVE M2 command instructs the outer arm to move to an initial position. In step 208, a PROFILE command instructs the movement of the magnetron according to a designated scan path for a designated length of time. At the completion of the PROFILE step 208, the plasma is extinguished and control returns to the ROTATE step 202. During this period, the wafer processed according to the profile is removed from the chamber and replaced by a fresh wafer.

Figure 6:
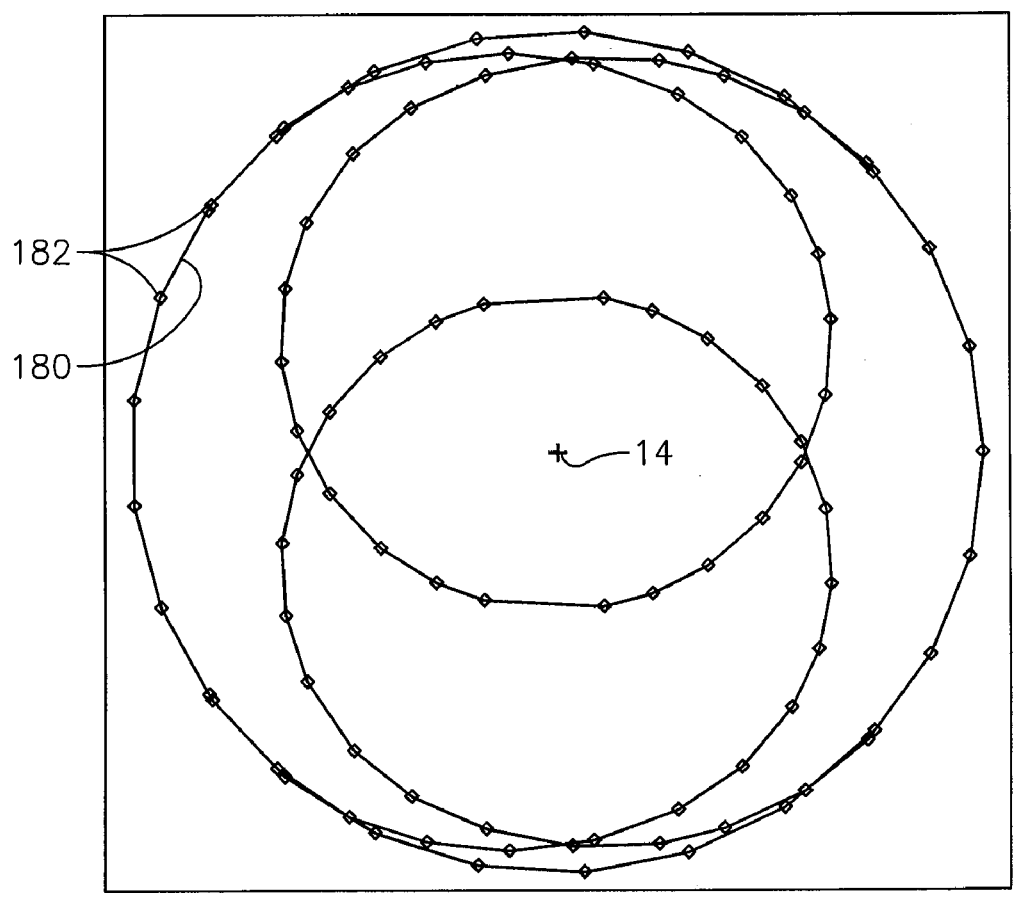
FIG. 6 is a plan view of a complex profile for a magnetron scanning pattern.
Figure 7:
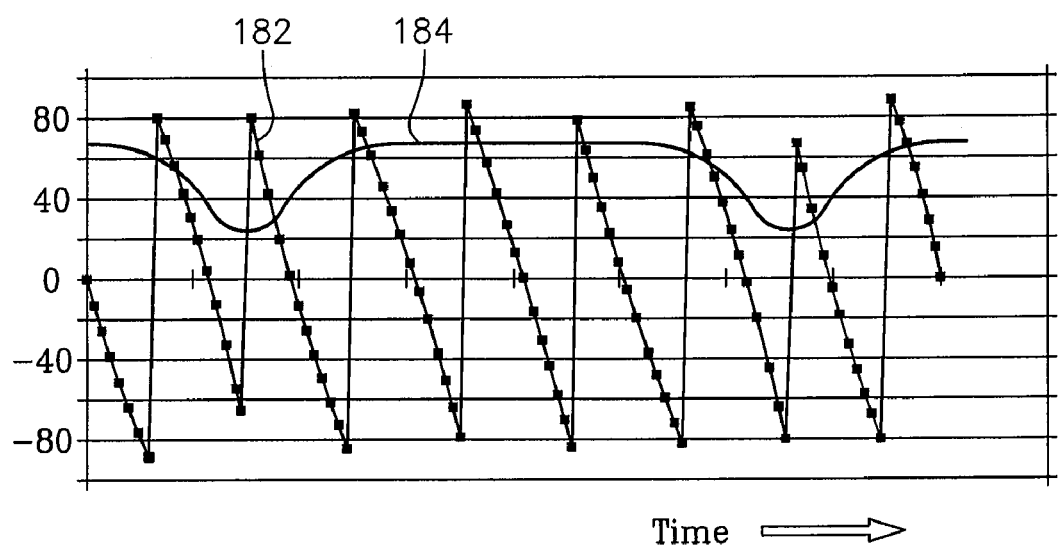
FIG. 7 is a graph illustrating the angle and radius of the magnetron following the profile of FIG. 6.

It is desirable that the scan pattern, for example, of FIG. 6 or 7 be triggered by the PROFILE command and not be referenced to a set angular position on the target assembly 18. The traces 182, 184 of FIG. 7 can be referenced to an initial angular position at time equal to zero and change from the actual angular occurring at that time. Typically, azimuthal angle during processing of a wafer is not important as long as proper averaging is achieved, but it is desired that the target sputtering be azimuthally averaged to prevent local over sputtering, for example, between the areas of the illustrated tracks if they were repeated for each wafer.

A "6" command code indicates a CONFIRM HOME command, which is somewhat similar to a HOME command but is performed on the fly, that is, while the arms are rotating at operational rates to determine that synchronization has not been lost between the motors because of belt slippage or other reasons. The operation on the fly is quicker than the home operation and also indicates if there is a problem with loss of the original homing position.

The operation of the CONFIRM HOME command assumes that the motors and arms are synchronously rotating according to the ROTATE command. The M2 motor 32 is instructed to move the magnet arm 130 to a position where its reflector 142 should pass under the associated sensor 166. The magnet arm sensor 166 should be triggered once per revolution with a few degrees of the rotary position based on the previous homing operation. If it does, the state calibrated in the previous HOME command is valid. If not, an alarm is flagged and trouble shooting is required. The magnet arm sensor 166 should similarly be triggered once every revolution. If not, an alarm is flagged and a HOME command is issued to rehome the motor drives 154, 156. If homing is confirmed for two consecutive rotations, the magnet arm 130 is returned to its original position and rotation continues until instructed otherwise.

A "7" command code indicates a SPIN M2 command, which allows the magnet arm 130 to rotate at a different rate and even direction than the gearbox 120, that is, to rotate asynchronously. Its four bytes of data specify the speed of the M2 motor 32 for the magnet arm 130. The speed data is signed and a negative value indicates reverse or retrograde rotation relative to the gearbox 120.

An "8" command code indicates a STOP SPIN M2 command, which stops the asynchronous spinning of magnet arm 130 resulting from the SPIN M2 command. Instead, the M2 motor 32 is instructed to rotate or at least place the magnet arm 130 in synchronism with the gearbox 120, that is, according to the any previously issued ROTATE command. The phase between the two motions is indicated by the angle data included in the STOP SPIN M2 command.

A "9" command code indicates a MOVE M1 command, which instructs the M1 motor 32 to rotate or move the gearbox to a position indicated by the data of the MOVE M1 command. This is a static operation. The state of the other, M2 motor 36 does not matter.

An "A" command code indicates a CLEAR ALARM code, which instructs the motion controller 150 to clear any previously issued alarm flags and return to normal operation.

A command code "B" indicates SET ROTATION ACCEL, which sets the ROTATION acceleration for both motors according its included data. This command should be sent before any ROTATION command is sent and remains in force thereafter.

"C" and "D" command codes indicate respectively a SET MOVE M2 ACCEL command and a SET MOVE M2 SPEED command, which set the acceleration and speed applied in the MOVE M2 command in moving the magnet arm 130 to a position specified in the latter command.

Similarly, an "E" command code indicates a SET SPIN M2 ACCEL, which sets the acceleration used in the SPIN M2 command instructing the asynchronous spin rate of the magnet arm 130.

An "F" command code indicates a GET command, in which the system controller 88 interrogates the motion controller 150 for the value of a piece of data specified in the data field of the GET command. The data may be identification of the motion controller 150, alarm state, or a current value of control parameter being imposed on the motors.

Even though the motion controller 150 allows complex scanning patterns and rapid control of the servo motors, it also allows conventional scanning to be performed in which the servo motors are instructed to rotate at specified speeds for relatively long periods of time which could be handled by system controller 88 alone.

The Dnet communication link 152 is bidirectional so that the motion controller 150 not only receives instructions but also sends responses to the system controller 88. A response may be automatically returned after a command has been received to inform the system controller 88 that the commanded action has been completed or perhaps that it failed and accompanying data may confirm the desired operational parameters. The CONFIRM HOME command in particular is expecting a response. A response may include an alarm fault flag. The response may follow a GET command in which requested data are returned to the system controller 88.

A response format is similar to the command format of TABLE 1 but may be longer in some response types to accommodate two or more pieces of data sent to the system controller 88. The response advantageously includes the previously described command ticket, The invention may be applied to other types of scanning mechanisms requiring two or more motors to be separately controlled to effect a nearly arbitrary scanning pattern, particularly if the motors need to be asynchronously operated. The motors may be of types other than servo motors. The communication links are not limited to the types described, but the invention provides significant advantages when the communication link to the motors operates significantly faster than the link to the host controller.

The invention thus allows the magnetron to be scanned in complex patterns without a significant upgrade or even modification of the system controller. The invention also provides an efficient procedure for confirming the homing condition of the motor magnetron without impacting the throughput of the system.

The invention claimed is:

1. A control mechanism for controlling the movement of a magnetron in a sputtering chamber having a scanning mechanism for allowing azimuthal and radial movement of the magnetron about a central axis, comprising:
    two motors mechanically coupled to the scanning mechanism; and
    a motion controller connected over a polling communication link to a system controller and receiving commands for a scanning path of the magnetron and separately controlling rotational speeds of the two motors and rotational phase therebetween.

2. The control mechanism of claim 1, further comprising two drive circuits connected between the motion controller and respective ones of the motors.

3. The control mechanism of claim 2, wherein the motors are servo motors and the drive circuits receive encoder signals from the respective motors.

4. The control mechanism of claim 1,
    wherein the motion controller includes a memory recorded with a plurality of scanning profiles for the scanning path, wherein a plurality of the scanning profiles include radial and azimuthal movements about the central axis;
    wherein a profile command sent from the system controller selects a scanning profile; and
    wherein the motion controller controls the rotation speed and rotational phase according to the selected scanning profile.

5. The control mechanism of claim 4, wherein the scanning profile includes a plurality of pairs of time and said rotation phase.

6. The control mechanism of claim 1, wherein the commands include a command ticket and wherein the motion controller stores as first value of the command ticket received in a first command and executes an immediately subsequent command only if a value of its command ticket is an acceptable value other than the first value.

7. The control mechanism of claim 1, further comprising:
    a first arm rotatable about a central axis;
    a second arm rotatable about a pivot axis on the first arm offset from the central axis and supporting the magnetron at a point offset from the pivot axis;
    a first sensor disposed to detect the presence of the first arm; and
    a second sensor disposed to detect the presence of the second arm;
    wherein the commands include a dynamic homing command; and
    wherein the motion controller in response to the dynamic homing command processes signals from the first and second sensors while the arms are in motion to determine if the arms are at predetermined positions at predetermined times.

8. The control mechanism of claim 7, wherein the first and second sensors are disposed at two different radii from the central axis.

9. The control mechanism of claim 8, wherein the sensors are optical sensors, each emitting a beam of light along a respective direction parallel to the central axis and detecting light, and further comprising reflectors disposed on the first and second arms to reflect a respective light beam.

10. A method of controlling a two-axis scanning mechanism for a magnetron rotating adjacent a target in a plasma sputter chamber, comprising the steps of:
- periodically sending commands to a motion controller, wherein one of the commands is a dynamic homing command;
- interpreting those commands in the motion controller to send drive signals to two motors coupled to the scanning mechanism to execute a scanning path of the magnetron adjacent the target; and
- upon sending of the dynamic homing command, the motion controller interrogates two sensors sensing positions of two portions of the scanning mechanism to determine if the portions are at preselected positions at preselected times, wherein the two sensors are directed at the scanning mechanism along respective directions parallel to a central axis of the plasma sputter chamber about which central axis the magnetron executes radial and azimuthal movement.

11. The method of claim 10, further comprising storing in the motion controller a plurality of scanning profiles, at least some of which include variations in movements of the magnetron in both of the two axes,
- wherein one of the commands is a profile command selecting one of the scanning profiles and the motion controller sends the drive signal which causes the scanning mechanism to execute the scanning path corresponding to the selected scanning profile.

12. The method of claim 10, wherein each command includes a command ticket having one of a plurality of operational values and wherein the motion controller interprets the command only if its command ticket has an operational value different from that of an immediately previously sent command.

13. The method of claim 10, wherein, if the portions are not at the preselected positions at the preselected time, rehoming the scan mechanism.

14. The method of claim 11, wherein at least some of the scanning profiles include varying radial components and varying azimuthal components about a central axis of the plasma sputter chamber while a substrate is being processed therein.

15. The control mechanism of claim 1, wherein the rotational phase between the rotational speeds of the two motors is controlled while the two motors are rotating.

16. A control mechanism for controlling the movement in a sputter chamber, comprising:
- a magnetron;
- a scanning mechanism allowing azimuthal and radial movement of the magnetron about a central axis;
- two separately rotatable coaxial shafts extending along the central axis and supporting the scanning mechanism;
- two motors differentially and mechanically coupled to the two shafts; and
- a controller separately controlling rotational rates of the two motors and a rotational phase between the rotational rates.

17. The control mechanism of claim 16, wherein the controller is programmable with a plurality of scanning profiles of the magnetron having varying azimuthal and varying radial components about the central axis.

* * * * *